(12) United States Patent
Lim

(10) Patent No.: US 8,889,563 B2
(45) Date of Patent: Nov. 18, 2014

(54) METHOD AND APPARATUS FOR ETCHING THE SILICON OXIDE LAYER OF A SEMICONDUCTOR SUBSTRATE

(75) Inventor: Kwon-Taek Lim, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 198 days.

(21) Appl. No.: 13/024,782

(22) Filed: Feb. 10, 2011

(65) Prior Publication Data

US 2012/0196445 A1     Aug. 2, 2012

(30) Foreign Application Priority Data

Jan. 27, 2011   (KR) ........................ 10-2011-0008163

(51) Int. Cl.
*H01L 21/306* (2006.01)
*B81C 1/00* (2006.01)
*H01L 21/311* (2006.01)

(52) U.S. Cl.
CPC ...... *H01L 21/31111* (2013.01); *B81C 1/00928* (2013.01); *B81C 2201/117* (2013.01)
USPC .................................. 438/706; 257/E21.219

(58) Field of Classification Search
CPC ..................... H01L 21/31111; B81C 1/00928; B81C 2201/117

USPC ........ 348/706, 743; 430/270.1; 257/E21.219; 438/706, 743
See application file for complete search history.

(56) References Cited

U.S. PATENT DOCUMENTS

2007/0293054 A1*  12/2007  Lee et al. ....................... 438/743
2008/0124648 A1*   5/2008  Namatsu et al. ........... 430/270.1

OTHER PUBLICATIONS

Lee et al.: Dry Release for Surface Mocromachining with HF Vapor-Phase Etching, Journal of Microelectromechanical Systems, vol. 6, No. 3, Sep. 1997.
Jones III et al.: HF Etchant Solutions in Supercritical Carbon Dioxide for "Dry" Etch Processing of Microelectronic Devices, Chem. Mater. 2003, 15, 2867-2869, Jun. 28, 2003.
Hwang et al.: The sacrificial oxide etching of poly-Si cantilevers having high aspect ratios using supercritical CO2, Microelectronic Engineering, Dec. 28, 2009.

* cited by examiner

*Primary Examiner* — Nadine Norton
*Assistant Examiner* — Mahmoud Dahimene
(74) *Attorney, Agent, or Firm* — Kinney & Lange, P.A.

(57) ABSTRACT

An aspect of the invention is to provide a method and apparatus for etching the silicon oxide layer of a semiconductor substrate, whereby the processing time for cleaning or rinsing, as well as any undesired aftereffects by residual hydrofluoric acid, may be reduced, in using the dry etching method involving the use of dense carbon dioxide that contains hydrofluoric acid, during the manufacturing process of a micro-electronic device.

8 Claims, 2 Drawing Sheets

METHOD AND APPARATUS FOR ETCHING THE SILICON OXIDE LAYER OF A SEMICONDUCTOR SUBSTRATE

CROSS-REFERENCE TO RELATED APPLICATIONS

This application claims the benefit of Korean Patent Application No. 10-2011-0008163, filed with the Korean Intellectual Property Office on Jan. 27, 2011, the disclosure of which is incorporated herein by reference in its entirety.

BACKGROUND

1. Technical Field

The present invention relates to a method and apparatus for etching the silicon oxide layer of a semiconductor substrate, more particularly to an etching method and an etching apparatus that enables the removal of a sacrificial layer composed of silicon oxide from a MEMS (Micro-Electro Mechanical System) and other types of semiconductor substrate in a short period of time without damage to the structural layer or mutual stiction of the structures.

2. Description of the Related Art

A micro-electronic system is a device which integrates mechanical and electric components on a single silicon wafer. Electric and mechanical components are produced by typical integrated circuit techniques and micro-mechanization processes. Micro-mechanization is used to produce a great number of devices for detecting and controlling the environment on a wafer, including but not limited to cantilever beams, hinges, accelerometers, micro-drivers, and micro-mirrors.

Mechanical components on the wafer of a micro-electronic device are produced by the depositing of sacrificial and structural layers on a substrate. This is followed by selective etching of the sacrificial layer in relation to the structural layer, leaving suspended or freestanding structures such as a beam or a lever. A main problem in manufacturing an MEMS is that stiction may occur in the water system based on the sacrificial layer etching process, and here the surface adhesive force is greater than the mechanical restoring force. The cause of the aforementioned stiction is due to van der Waals forces, hydrogen bridging, electrostatic attractions between micro-structure and the substrate, surface tension occurring from the reducing liquid menisci trapped in the etched space, and the etching byproduct precipitated from the solution during the drying phase.

According to the related art, the manufacturing process of a micro-electronic device, such as a MEMS (Micro Electron Machine) or DRAM, requires an etching process for forming a hollow structure; for example, the etching of a sacrificial layer, which may be a single silicon layer, such as silicone oxide layer, ideally a CVD-type oxide layer, a doping oxide layer (e.g. TEOS layer, PSG layer, BSG layer, and BPSG layer) and a thermal or native oxide layer (e.g. thermal $SiO_2$ and native silicon dioxide), or silicon oxide layers of two or more kinds existing on a substrate. But if this were to be done by the wet etching method, adhesion often occurs. In other words, during the final drying process, stiction occurs whereby patterns stick to each other due to the surface tension of a solvent such as water and alcohol.

The manufacture of semiconductors and micro-electronic mechanical system technology thus involve various micro-structural manufacturing processes, during which a large amount of toxic chemicals and expensive ultrapure water are used. Besides the environmental needs, there is the problem of difficulty in controlling hyperfine structures with the existing technology.

As a method of resolving this, isotropic dry etching methods, such as supercritical carbon dioxide (Chem. Mater. 15 (2003) 2867-2869) containing hydrofluoric acid (HF), and alcohol chemical vapor etching (J. Microelectromech. Syst. 6 (1997) 226-233), are being studied. In recent times, a method of using supercritical carbon dioxide as a reactive fluid is actively being developed (Microelectronic Engineering 87 (2010) 1696-1700).

For the aforementioned isotropic dry etching method using supercritical carbon dioxide containing hydrofluoric acid (HF), supercritical carbon dioxide is used. Carbon dioxide has comparatively low critical temperature and critical pressure (31.1° C., 1070 psi), having the advantage of easily reaching the supercritical condition. Once the supercritical condition is reached, a low level of viscosity is obtained, and the surface tension approaches zero, thus showing diffusivity and penetration properties comparable to a gas, along with density comparable to a liquid showing its capacity as a solvent. Thus, it is used as a fluid for the etching and cleaning of complex structures having micro-patterns of high aspect ratios.

However, the inventors of the present invention have discovered that, in the cleaning or rinsing process of supercritical carbon dioxide, which inevitably follows in the dry etching process that uses supercritical carbon dioxide containing hydrofluoric acid, there is the disadvantage of the process time being very long for the interior of the reactor to reach the supercritical carbon dioxide condition, due to the high diffusivity of supercritical carbon dioxide.

Thus, in order to resolve the aforementioned problem, and based on the fact that supercritical helium has a lower density than that of supercritical carbon dioxide and does not mix with supercritical carbon dioxide, the inventors of the present invention have come to conceive a method and apparatus for etching the silicon oxide layer of a semiconductor substrate, where supercritical helium is injected and used as a barrier after the etching using supercritical carbon dioxide and before the injecting of pure supercritical carbon dioxide.

SUMMARY

An aspect of the invention is to provide a method and apparatus for etching the silicon oxide layer of a semiconductor substrate, whereby the processing time for cleaning or rinsing, as well as any undesired aftereffects by residual hydrofluoric acid, may be reduced, in using the dry etching method involving the use of dense carbon dioxide that contains hydrofluoric acid, during the manufacturing process of a micro-electronic device.

Another aspect of the invention is to provide a method and apparatus for etching the silicon oxide layer of a semiconductor substrate with a short processing time and superior reproducibility.

One aspect of the invention provides a method for etching a silicon oxide layer of a semiconductor substrate that includes:

placing a semiconductor substrate, on which a structure is formed, onto a platform of a reaction chamber (operation S10);

etching a silicon oxide layer of the semiconductor substrate by supplying dense carbon dioxide into the reaction chamber and injection an etchant (operation S20);

discharging a fluid inside the reaction chamber from a lower part of the reaction chamber by injecting supercritical helium to an upper part of the reaction chamber, after etching the silicon oxide layer of the semiconductor substrate (operation S30);

discharging the supercritical helium from an upper part of the reaction chamber by injecting dense carbon dioxide to a lower part of the reaction chamber (operation S40);

drying the semiconductor substrate by decompressing an inside of the reaction chamber (operation S50).

Another aspect of the invention provides an apparatus for etching a silicon oxide layer of a semiconductor substrate that includes:

a reaction chamber, in which a semiconductor substrate having a silicon oxide layer is placed;

an etchant reservoir for supplying etchant into the reaction chamber;

a pressure pump for injecting the etchant into the reaction chamber;

a carbon dioxide cylinder for providing carbon dioxide;

a pressure pump for pressurizing carbon dioxide supplied from the carbon dioxide cylinder to provide dense carbon dioxide and supplying the dense carbon dioxide to the reaction chamber;

a helium cylinder for providing supercritical helium;

a pressure pump for supplying the supercritical helium supplied from the helium cylinder to the reaction chamber;

a three-way valve for injecting and discharging dense carbon dioxide, etchant, and supercritical helium into and from the reaction chamber; and a discharge pipe for discharging the dense carbon dioxide and the etchant used in etching from the reaction chamber.

In an embodiment of the invention, the structure formed on the semiconductor substrate can be a MEMS (micro-electromechanical system) micro-structure, a NEMS (nano-electromechanical system) micro-structure, or a DRAM (dynamic random access memory) device.

The dense carbon dioxide may preferably contain liquid carbon dioxide and supercritical carbon dioxide within the temperature range of 20° C. to 100° C. and within the pressure range of 5.52 MPa to 34.5 MPa.

In operation S20, the etchant may preferably be mixed at a 0.001-10 percent weight of dense carbon dioxide, and the etchant can be a mixture of a fluorine compound and a co-solvent.

For the fluorine compound, hydrofluoric acid (HF), hydrofluoroether (HFE), poly-4-vinylpyridinium poly(hydrogen fluoride), hydrogen fluoride 2,4,6-trimethylpyridine, ammonium fluoride ($NH_4F$), etc., may be used.

For the co-solvent, deionized water or a mixture of deionized water and alcohol may be used, where methanol, ethanol, isopropyl alcohol, butanol, etc., may be used for the alcohol.

Certain embodiments of the invention provide a method and apparatus for etching the silicon oxide layer of a semiconductor substrate with a short processing time and superior reproducibility, by reducing the processing time for cleaning or rinsing, as well as any undesired aftereffects by residual hydrofluoric acid, in using the dry etching method involving the use of dense carbon dioxide that contains hydrofluoric acid, during the manufacturing process of a microelectronic device.

Additional aspects and advantages of the present invention will be set forth in part in the description which follows, and in part will be obvious from the description, or may be learned by practice of the invention.

DETAILED DESCRIPTION

Certain embodiments of the present invention will be described below in more detail.

An embodiment of the present invention provides a method of etching a silicon oxide layer of a semiconductor substrate that includes: placing a semiconductor substrate having a structure onto a platform of a reaction chamber (operation S10); etching the silicon oxide layer of the semiconductor substrate by supplying dense carbon dioxide into the reaction chamber and injecting an etchant (operation S20); discharging the fluid inside the reaction chamber from a lower part of the reaction chamber by injecting supercritical helium into an upper part of the reaction chamber, after etching the silicon oxide layer of the semiconductor substrate (operation S30); discharging the supercritical helium from an upper part of the reaction chamber by injecting dense carbon dioxide into the lower part of the reaction chamber (operation S40); and drying the semiconductor substrate by decompressing the inside of the reaction chamber (operation S50).

Figure 1:
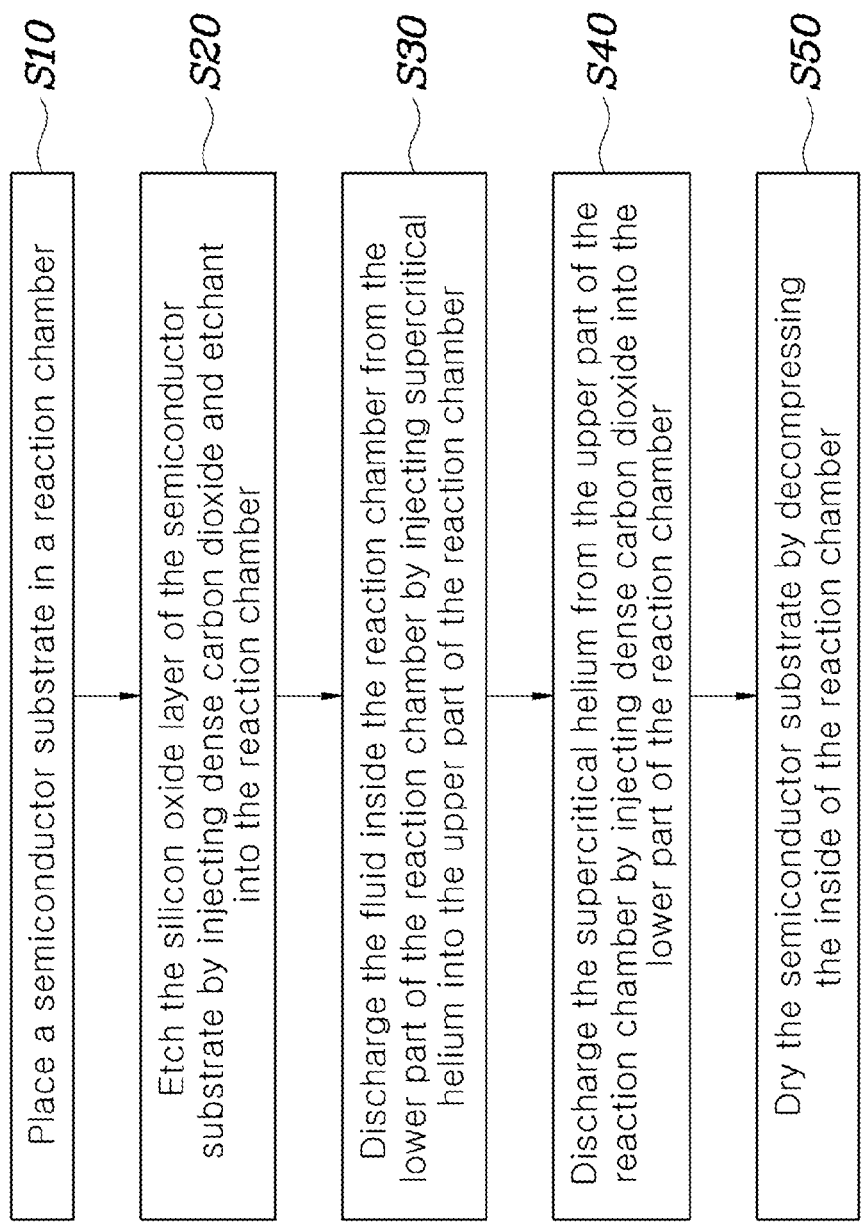
FIG. 1 is a process flowchart schematically illustrating the processes of a method for etching a silicon oxide layer of a semiconductor substrate according to an embodiment of the present invention.
Figure 2:
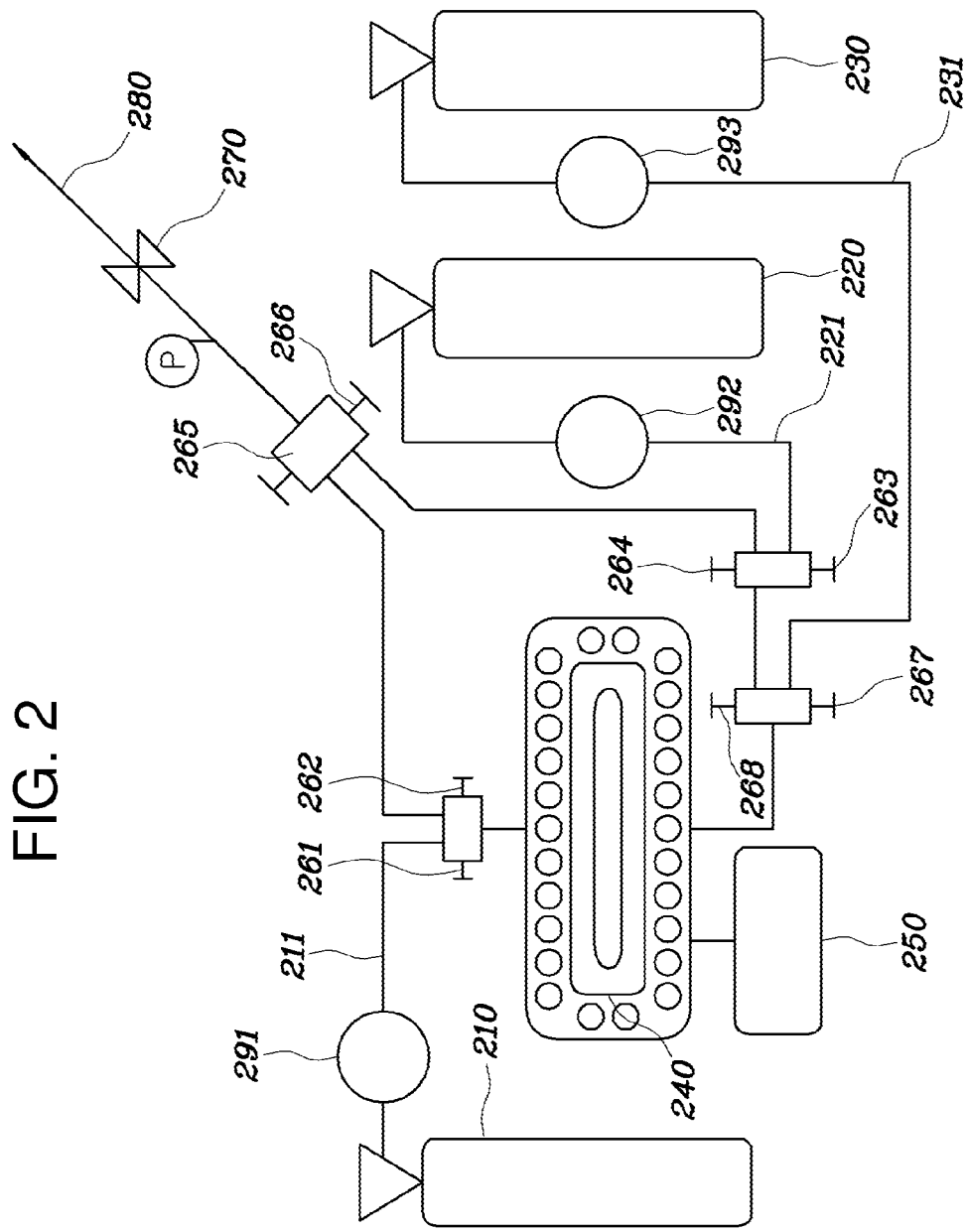
FIG. 2 is a drawing schematically illustrating the composition of the apparatus for etching a silicon oxide layer of a semiconductor substrate according to an embodiment of the present invention.

A method of etching a silicon oxide layer of a semiconductor substrate using an apparatus for etching according to an embodiment of the present invention will now be described with reference to FIGS. 1 and 2.

First, a semiconductor substrate having a structure formed on it is placed onto a platform of a reaction chamber 240, in order to etch the silicon oxide layer of the semiconductor substrate (operation S10).

The structure formed on the semiconductor substrate may be a MEMS (micro-electromechanical system) micro-structure, a NEMS (nano-electromechanical system) micro-structure, or a DRAM (dynamic random access memory) device, but is not thus limited.

The reaction chamber 240 used in an embodiment of the invention is a structure that enables air-tight closure, and a reaction chamber is used that allows etching under conditions beyond the critical point. The reaction chamber 240 used in an embodiment of the invention may be largely divided into the upper part of the reaction chamber 240 and the lower part with a platform secured to its floor, and it is possible to separate the upper part, leaving the reaction chamber 240 in an open state. A thermostat 250 is connected between the outer wall and the inner wall of the reaction chamber 240, enabling the adjustment of temperature, and the reaction chamber 240 is constructed so as to be heated up by way of the thermostat 250.

Next, densified carbon dioxide is supplied into the reaction chamber 240, and the etchant is injected, etching the silicon oxide layer of the semiconductor substrate (operation S20).

After carbon dioxide supplied from the carbon dioxide cylinder 220 is turned into dense carbon dioxide by pressurization with a pressure pump 292, it is supplied through a pipe 221 into the reaction chamber 240, by regulating a three-way valve 263. At the same time, the etchant stored in the etchant reservoir 230 is supplied through a pipe 231 into the reaction chamber 240 by way of a pressure pump 293, by regulating a three-way valve 267. As the dense carbon dioxide and etchant are injected, etching is performed on the silicon oxide layer of the semiconductor substrate inside the reaction chamber 240, and the environment inside the reaction chamber 240 is maintained by use of a regulating apparatus (not pictured) that regulates temperature and stifling.

In more detail, carbon dioxide supplied from the carbon dioxide cylinder 220 is pumped by the pressure pump 292, passes through the pipe 221 and the three-way valves 263 and 268, is mixed with the etchant supplied from the etchant reservoir 230 by the pressure pump 293 through the pipe 231 and the three-way valve 267, and is transported to the interior of the reaction chamber 240. For example, after the interior of the reaction chamber 240 is filled with the carbon dioxide transported in a highly pressurized state, if the pressure control valve 207 is closed, the carbon dioxide can turn the interior of the reaction chamber 240 into a supercritical condition. Also, adjusting the thermostat 250 in operation, it is possible to make the temperature inside the reaction chamber 240 reach the temperature at the critical point of carbon dioxide ($T_c=31°$ C.) or go beyond that point. In addition, it is also possible, within the range wherein the pressure measurements from the pressure gauge (not pictured) support the pressure at the critical point of carbon dioxide, to adjust the opening of the pressure control valve 207 and to adjust the pressure of the pressure pump, and it becomes possible to have carbon dioxide supplied continuously into the reaction chamber 240.

The silicon oxide layer of the semiconductor substrate may be a TEOS (tetra ethyl orthosilicate) layer, a PSG (phosphorsilicate glass) layer, a BSG (borosilicate glass) layer, a BPSG (borophosphorsilicate glass) layer or a thermal $SiO_2$ layer, to be used as a sacrificial layer for forming structures when manufacturing a MEMS or a semiconductor cylinder capacitor.

The dense carbon dioxide used can contain liquid carbon dioxide and supercritical carbon dioxide within the temperature range of 20° C. to 100° C. and within the pressure range of 5.52 MPa to 34.5 MPa, and for the etchant, a mixture of a fluorine compound and a co-solvent can be used.

For the fluorine compound, hydrofluoric acid (HF), hydrofluoroether (HFE), poly-4-vinylpyridinium poly(hydrogen fluoride), hydrogen fluoride 2,4,6-trimethylpyridine, or ammonium fluoride ($NH_4F$) may be used, but it is not thus limited, and any compound that is generally used in the etching process of a silicon oxide layer of a semiconductor substrate may be used.

For the co-solvent, deionized water on its own, or a mixture of deionized water and alcohol may be used.

For the alcohol, methanol, ethanol, isopropyl alcohol, butanol, etc., may be used.

The etchant for etching the silicon oxide layer of a semiconductor substrate may be used at 0.001-10 percent weight of dense carbon dioxide, preferably at 0.01-1 percent weight, and more preferably may be used at a content level that allows it to be mixed with carbon dioxide to become a completely uniform solution. In other words, in operation S20, in order to etch the silicon oxide layer of the semiconductor substrate, the dense carbon dioxide may be used into which the etchant is dissolved at 0.001 to 10 percent weight.

Also, the etching process in operation S20 may have a temperature within the range of 33-120° C. inside the reaction chamber, preferably within the range of 40-80° C. The pressure may be within the range of 5.52-34.5 MPa.

If deionized water contained in the co-solvent is used in excess of the solubility of dense carbon dioxide within the given temperature and pressure, the excess deionized water is removed by regulating the removal operation of fluid inside the reaction chamber, described below. In other words, when deionized water in excess of the weight % for making a uniform solution with dense carbon dioxide is used, the deionized water should be completely removed from the interior of the reaction chamber, after the reaction is completed, by separating the delaminated co-solvent or by rinsing with a large amount of pure dense carbon dioxide, before the operation of drying the substrate by decompressing the interior of the reaction chamber.

Next, after etching the silicon oxide layer of the semiconductor substrate, supercritical helium is injected into the upper part of the reaction chamber, discharging the fluid inside the reaction chamber from the lower part of the reaction chamber (operation S30).

In the method of etching the silicon oxide layer of a semiconductor substrate according to an embodiment of the present invention, after etching the silicon oxide layer of a semiconductor substrate using dense carbon dioxide and etchant, supercritical helium is injected into the upper part of the reaction chamber 240, discharging the fluid inside the reaction chamber 240, such as the supercritical carbon dioxide reactant, residual etchant, etc., from the lower part of the reaction chamber 240.

Helium is an inert gas having a low level of reactivity. In almost all conditions helium exists as a monoatomic molecule, and does not react. Helium goes through phase variation into superfluid at 2.3 K under the pressure of 1 atm. Even solid helium, formed under high pressure, was found to display phenomena similar to a superfluid. Such characteristics of helium make its density lower than the density of an actual gas closest to an ideal gas and dissolve at less than 5 weight % in carbon dioxide.

Using such characteristics of helium, after etching the silicon oxide layer of a semiconductor substrate using dense carbon dioxide and etchant, the processing time may be drastically shortened, and etching reproducibility may be improved, preventing any aftereffects due to residuals, by injecting supercritical helium and using it as a barrier, and subsequently by injecting pure dense carbon dioxide into the lower part of the reaction chamber 240, discharging the helium inside the reaction chamber 240 from the upper part of the reaction chamber 240, performing cleaning and rinsing, and decompressing.

Supercritical helium is supplied into the reaction chamber 240 from the helium cylinder 210, where supercritical helium is pressurized and contained, through the pipe 211, with the adjustment of a three-way valve 261. If the helium cylinder 210 is used that is controlled to have a particular amount of pressure, it is possible to inject supercritical helium into the reaction chamber 240 with only the existing cylinder pressure, without connecting a pressure pump 291 to the pipe 211.

If supercritical helium is supplied into the upper part of the reaction chamber 240 in the aforementioned manner, the etching reactant is discharged from the lower part of the reaction chamber 240.

Next, the supercritical helium is discharged from the upper part of the reaction chamber by injecting dense carbon dioxide into the lower part of the reaction chamber (operation S40).

In more detail, when the etching reactant and residual etchant are discharged from the lower part of the reaction chamber 240 in operation S30, pure dense carbon dioxide is supplied from the lower part of the reaction chamber 240 by way of the pressure pump 292, while at the same time, the supercritical helium fluid is exhausted through a discharge passage in the upper part of the reaction chamber 240, to perform the processes of cleaning and rinsing. In this case, the cleaning and rinsing processes of the reaction chamber are performed successively within the reaction chamber 240 under conditions approaching the critical point of carbon dioxide.

The apparatus for etching a silicon oxide layer of a semiconductor substrate according to an embodiment of the present invention is equipped with a pressure control valve 270 (back-pressure regulator), which controls the discharge pressure and discharge amount of the dense carbon dioxide, etchant, and supercritical helium, and with three-way valves 261-268, which discharge the fluid inside the reaction chamber 240, to be able to regulate flow. The pressure control valve 270 controls the opening according to the result of pressure measurements taken by the pressure gauge, and controls the amount of fluid discharged from the final discharge pipe 280.

The cleaning and rinsing processes of the reaction chamber 240 in operation S40 may preferably be performed within the temperature range of 20-100° C. and the pressure range of 5.52-34.5 MPa.

Lastly, the semiconductor substrate is dried by decompressing the inside of the reaction chamber (operation S50).

In order to dry the semiconductor substrate placed inside the reaction chamber 240, the three-way valves are closed, stopping the supply of the dense carbon dioxide, and the discharge pipe is completely opened, discharging the fluid inside the reaction chamber, thus decompressing the inside and drying the semiconductor substrate.

Below, certain examples are disclosed in order to help understand the present invention, but the embodiments are for illustrative purposes only and do not limit the invention. It is to be appreciated that those skilled in the art can change or modify the embodiments without departing from the scope and spirit of the invention. All variations coming within the meaning and range of equivalency of the claims are embraced within their scope.

EXAMPLES

Example 1

In order to etch a semiconductor substrate having a silicon oxide layer 1000 nm thick, the semiconductor substrate was placed inside the reaction chamber 240, and an etchant using a fluorine compound and a co-solvent, more specifically an etchant obtained by mixing hydrofluoric acid (HF) and deionized water in a ratio of 1:2, was mixed with dense carbon dioxide through the etchant reservoir 230, pipe 231, and three-way valve 267. At the same time, dense carbon dioxide, from the carbon dioxide cylinder 220 through the pipe 221 and three-way valves 263 and 268, was mixed with the etchant. The pressure pumps 292 and 293 were set to regulate the amount of flow such that the etchant is mixed with the dense carbon dioxide at 0.07 weight %. Once the etchant and dense carbon dioxide filled the reaction chamber 240, all of the three-way valves were closed, and the etching reaction was executed under the conditions of supercritical carbon dioxide pressure 13.1 MPa and temperature 50° C., for five minutes. After the etching reaction was completed, supercritical helium was injected into the upper part of the reaction chamber 240 from the helium cylinder 210 through the pipe 211 and three-way valve 261, at the pressure of 13.8 MPa. Subsequently, the fluid inside the reaction chamber 240 was discharged through the three-way valves 264, 266, and 268, pressure control valve 270, and discharge pipe 280. Next, the injection of supercritical helium was stopped, and pure dense carbon dioxide was injected into the reaction chamber 240 from the carbon dioxide cylinder 220 through the pipe 221 and three-way valves 263 and 268, with the pressure maintained at 14.5 MPa by the pressure pump 292. Subsequently, the supercritical helium inside the reaction chamber 240 was discharged through the three-way valves 262 and 265, pressure control valve 270, and the final discharge pipe. Finally, the injection of supercritical carbon dioxide was stopped, the dense carbon dioxide was decompressed by way of the three-way valves 262 and 265 and the pressure control valve 270, the reaction chamber 240 was opened, the semiconductor substrate was taken out, and the thickness of the etched silicon oxide layer was measured with a spectroscopic ellipsometer. Five measurements were taken using the same method, and the results are shown in Table 1.

TABLE 1

| Rounds | $1^{st}$ | $2^{nd}$ | $3^{rd}$ | $4^{th}$ | $5^{th}$ |
|---|---|---|---|---|---|
| Thickness of silicon oxide layer (nm) | 362.3 | 359 | 349.9 | 358.7 | 370.1 |

As shown in Table 1 above, when the silicon oxide layer of a semiconductor substrate is etched according to an embodiment of the present invention, the differences in etched thickness from the repeated etching process are shown to be less than 5 percent, thus showing superior etching reproducibility.

[Comparison 1]

In order to etch a semiconductor substrate having a silicon oxide layer 1000 nm thick, the semiconductor substrate was placed inside the reaction chamber 240, and an etchant using a fluorine compound and a co-solvent, more specifically an etchant obtained by mixing hydrofluoric acid (HF) and deionized water in a ratio of 1:2, was mixed with dense carbon dioxide through the etchant reservoir 230, pipe 231, and three-way valve 267. At the same time, dense carbon dioxide, from the carbon dioxide cylinder 220 through the pipe 221 and three-way valves 263 and 268, was mixed with the etchant. The pressure pumps 292 and 293 were set to regulate the amount of flow such that the etchant is mixed with the dense carbon dioxide at 0.07 weight %. Once the etchant and dense carbon dioxide filled the reaction chamber 240, all of the three-way valves were closed, and the etching reaction was executed under the conditions of dense carbon dioxide pressure 13.1 MPa and temperature 50° C., for five minutes. After the etching reaction was completed, the dense carbon dioxide was decompressed by way of the three-way valves 262 and 265 and the pressure control valve 270, the reaction chamber 240 was opened, the semiconductor substrate was taken out, and the thickness of the etched silicon oxide layer was measured with a spectroscopic ellipsometer. Five measurements were taken using the same method, and the results are shown in Table 2.

TABLE 2

| Rounds | $1^{st}$ | $2^{nd}$ | $3^{rd}$ | $4^{th}$ | $5^{th}$ |
|---|---|---|---|---|---|
| Thickness of silicon oxide layer (nm) | 395 | 306.4 | 384.8 | 426.4 | 233 |

With reference to Table 2, unlike in Example 1, the differences in the etched thickness from the repeated etching process are shown to be more than 30 percent in Comparison 1, where supercritical helium was not used as a barrier after the etching reaction, thus showing lower etching reproducibility.

[Comparison 2]

In order to etch a semiconductor substrate having a silicon oxide layer 1000 nm thick, the semiconductor substrate was placed inside the reaction chamber 240, and an etchant using a fluorine compound and a co-solvent, more specifically an etchant obtained by mixing hydrofluoric acid (HF) and deionized water in a ratio of 1:2, was mixed with dense carbon dioxide through the etchant reservoir 230, pipe 231, and three-way valve 267. At the same time, dense carbon dioxide, from the carbon dioxide cylinder 220 through the pipe 221 and three-way valves 263 and 268, was mixed with the etchant. The pressure pumps 292 and 293 were set to regulate the amount of flow such that the etchant is mixed with the dense carbon dioxide at 0.07 weight %. Once the etchant and dense carbon dioxide filled the reaction chamber 240, all of the three-way valves were closed, and the etching reaction was executed under the conditions of dense carbon dioxide pressure 13.1 MPa and temperature 50° C., for five minutes. After the etching reaction was completed, dense carbon dioxide was introduced through the three-way valves 262 and 265, the pressure control valve 270, and the final discharge pipe 280, under the same conditions of temperature and pressure as in Example 1 at a flow rate of 5 mL/min for 20 minutes. Next, the injection of supercritical carbon dioxide was stopped, the pressure control valve 270 was completely opened, the dense carbon dioxide was decompressed by way of the three-way valves 262 and 265 and the pressure control valve 270, the reaction chamber 240 was opened, the semiconductor substrate was taken out, and the thickness of the etched silicon oxide layer was measured with a spectroscopic ellipsometer. Five measurements were taken using the same method, and the results are shown in Table 3.

TABLE 3

| Rounds | $1^{st}$ | $2^{nd}$ | $3^{rd}$ | $4^{th}$ | $5^{th}$ |
|---|---|---|---|---|---|
| Thickness of silicon oxide layer (nm) | 407 | 472.6 | 415 | 297.6 | 259.3 |

With reference to Table 3, unlike in Example 1, the differences in the etched thickness from the repeated etching process are shown to be more than 30 percent in Comparison 1, where supercritical helium was not used as a barrier after the etching reaction, thus showing lower etching reproducibility, and from this it can be seen that it took more than 20 minutes for a complete replacement with pure dense carbon dioxide by the back-diffusion of dense carbon dioxide, and during that time additional etching occurred.

Test Example 1

Measured Performance of Supercritical Helium as a Barrier According to the Direction of Injection (1) Supercritical Helium Injected from the Upper Part to the Lower Part of the Reaction Chamber In order to observe the performance of supercritical helium as a barrier, supercritical helium was injected into the upper part of the reaction chamber 240, and the discharge pipe was operated at the lower part of the reaction chamber 240. First, after the inside of the reaction chamber 240 was filled with carbon dioxide at the pressure level of 1900 psi (13.1 MPa), helium at the pressure level of 2000 psi (13.8 MPa) was introduced into the reaction chamber from the upper part of the reaction chamber 240. Because the pressure of helium was higher than that of carbon dioxide at this time, immediately after the injection of helium, as verified through a sapphire viewer cell attached to the reaction chamber 240, it could be verified that stratification occurred at the upper side. As a result, it could be verified that the two components decreased in the direction of discharge without getting mixed together, and that all carbon dioxide was discharged outside the reaction chamber 240 within 20 seconds, without decompression.

(2) Supercritical Helium Injected from the Lower Part to the Upper Part of the Reaction Chamber With the pipes modified, supercritical helium was injected into the lower part of the reaction chamber 240 under the same pressure conditions as above, the discharge pipe was placed at the upper part of the reaction chamber 240, and the performance was evaluated. As a result, it could be verified that turbulence was formed with the entering of helium. This is because helium, which is lighter than carbon dioxide, has the characteristic of trying to position itself above carbon dioxide, and it was learned that such conditions did not allow effective performance of a barrier.

(3) Supercritical Helium Injected from a Side of the Reaction Chamber

With the pipes modified, supercritical helium was injected from one side of the reaction chamber 240 under the same pressure conditions as above, the discharge pipe was made to face the opposite side of the reaction chamber 240, and the performance was evaluated. As a result, although the initial stages showed results similar to those of supercritical helium injected from the upper part to the lower part of the reaction chamber, once the level of dense carbon dioxide reached the height of the discharge outlet of the reaction chamber 240, the discharge rate of dense carbon dioxide slowed down, and the removal time also slowed down, so that such conditions did not allow effective performance of a barrier.

(4) Supercritical Helium Injected from the Upper Part to the Lower Part of the Reaction Chamber, then Dense Carbon Dioxide Injected from the Lower Part to the Upper Part of the Reaction Chamber After the fluid inside the reaction chamber 240 was discharged from the lower part of the reaction chamber 240 by the injection of supercritical helium having a level of pressure identical to or higher than that of dense carbon dioxide from the upper part of the reaction chamber 240, supercritical helium inside the reaction chamber 240 was discharged into the upper part of the reaction chamber 240 by the injection of pure dense carbon dioxide having the level of pressure identical to or higher than supercritical helium into the lower part of the reaction chamber 240. Viewed through the sapphire viewer cell attached to the reaction chamber 240, it was verified that at each process the fluid inside the reaction chamber was discharged effectively, without the dense carbon dioxide and supercritical helium getting mixed together or forming turbulence.

(5) Summary

The results of the experiments above put together show that, in the process of etching a silicon oxide layer of a semiconductor substrate according to an embodiment of the present invention, the use of supercritical helium may preferably be employed with the supercritical helium injected in the upper part of the reaction chamber and discharged from the lower part of the reaction chamber, and that, after supercritical helium is discharged, the cleaning and rinsing processes of the reaction chamber may preferably be performed with the discharge of supercritical helium in the reaction chamber from the upper part of the reaction chamber by providing pure dense carbon dioxide into the lower part of the reaction chamber.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method for etching a silicon oxide layer of a semiconductor substrate, the method comprising:
   placing a semiconductor substrate having a structure formed thereon onto a platform of a reaction chamber;
   etching a silicon oxide layer of the semiconductor substrate by supplying dense carbon dioxide into the reaction chamber and injecting an etchant;
   discharging fluid inside the reaction chamber from a lower part of the reaction chamber by injecting supercritical helium to an upper part of the reaction chamber, after etching the silicon oxide layer of the semiconductor substrate;
   discharging the supercritical helium from an upper part of the reaction chamber by injecting dense carbon dioxide to a lower part of the reaction chamber; and
   drying the semiconductor substrate by decompressing an inside of the reaction chamber;
   wherein the dense carbon dioxide is within a temperature range of 20° C. to 100° C. and within a pressure range of 5.52 MPa to 34.5 MPa.

2. The method for etching a silicon oxide layer of a semiconductor substrate according claim 1, wherein the structure formed on the semiconductor substrate is a MEMS micro-structure, a NEMS micro-structure, or a DRAM device.

3. The method for etching a silicon oxide layer of a semiconductor substrate according claim 1, wherein the etchant is a mixture of a fluorine compound and a co-solvent.

4. The method for etching a silicon oxide layer of a semiconductor substrate according to claim 3, wherein the fluorine compound is selected from a group consisting of hydrofluoric acid (HF), hydrofluoroether (HFE), poly-4-vinylpyridinium poly(hydrogen fluoride), hydrogen fluoride 2,4,6-trimethylpyridine, and ammonium fluoride ($NH_4F$).

5. The method for etching a silicon oxide layer of a semiconductor substrate according to claim 3, wherein the co-solvent is deionized water or a mixture of deionized water and alcohol.

6. The method for etching a silicon oxide layer of a semiconductor substrate according to claim 5, wherein the alcohol is methanol, ethanol, isopropyl alcohol, or butanol.

7. The method for etching a silicon oxide layer of a semiconductor substrate according to claim 1, wherein the etchant is mixed at a 0.001-10 percent weight of dense carbon dioxide, in the etching of the silicon oxide layer.

8. The method for etching a silicon oxide layer of a semiconductor substrate according to claim 1, wherein the silicon oxide layer is a TEOS (tetra ethyl orthosilicate) layer, a PSG (phosphorsilicate glass) layer, a BSG (borosilicate glass) layer, a BPSG (borophosphorsilicate glass) layer or a thermal $SiO_2$ layer.

* * * * *

UNITED STATES PATENT AND TRADEMARK OFFICE
CERTIFICATE OF CORRECTION

| | | |
|---|---|---|
| PATENT NO. | : 8,889,563 B2 | Page 1 of 1 |
| APPLICATION NO. | : 13/024782 | |
| DATED | : November 18, 2014 | |
| INVENTOR(S) | : Kwon-Taek Lim | |

It is certified that error appears in the above-identified patent and that said Letters Patent is hereby corrected as shown below:

In the Specification

Col. 2, Line 65
 Delete "injection"
 Insert --injecting--

Col. 3, Line 7
 Insert --and-- before "drying"

Col. 4, Line 67
 Delete "stifling"
 Insert --stirring--

Signed and Sealed this
Fourteenth Day of July, 2015

Michelle K. Lee
*Director of the United States Patent and Trademark Office*